CHANNEL SELECTOR SERVOSYSTEM

Filed June 6, 1956 2 Sheets-Sheet 1

INVENTOR.
LEO BEISER
BY Campbell, Brumbaugh, Free & Graves
his ATTORNEYS

INVENTOR.
LEO BEISER
BY Campbell, Brumbaugh, Free & Graves
his ATTORNEYS

United States Patent Office 2,821,676

Patented Jan. 28, 1958

2,821,676

CHANNEL SELECTOR SERVOSYSTEM

Leo Beiser, Flushing Manor, N. Y., assignor to Columbia Broadcasting System, Inc., New York, N. Y., a corporation of New York Application June 6, 1956, Serial No. 589,686

6 Claims. (Cl. 318—467)

This invention relates to automatic tuners for radio receivers and the like, and particularly to novel, push-button actuated automatic tuning mechanism that is of particular utility for automatic channel selection in television receivers, although it is not limited to such use.

Automatic push-button controlled tuning systems for radio receivers are well known. In some devices of the prior art, depression of a push-button performs the tuning operation through direct mechanical linkage with the tuning means. In others, depression of the push-button energizes driving means which drive an indicator and a tuner shaft, various means being employed to disable the driving means when the tuner reaches the correct tuning position.

The automatically driven devices of the prior art have been used principally in tuning radio receivers, where the only requirement is to drive a tuning shaft to a selected position in an even manner. Such apparatus is not well adapted for use with television channel selectors, where tuning is accomplished by stepping the tuning shaft to the several channel positions against the variable force exerted by the detent means that are used to establish the channel positions accurately and positively. In fact, up to the present time there has been no satisfactory automatic tuning device capable of stepping a television receiver tuning shaft selectively to the several channel positions while permitting a momentary period of dwell at each channel position to enable a viewer to sample the program being transmitted.

Accordingly, it is an object of the invention to provide an automatic tuning mechanism which is free from the above-noted deficiencies of the prior art.

Another object of the invention is to provide an automatic tuning mechanism for a television receiver which is smooth, positive and quiet in operation and which utilizes a minimum of electrical contacts.

A further object is to provide an automatic tuning mechanism for a television receiver which is adapted to step the receiver tuning shaft to successive channel positions and to provide a period of momentary dwell at each channel position so that the viewer can sample the program being transmitted.

These and other objects of the invention are attained by driving the receiver tuning shaft by motive means through power transmission means which is effective only during part of the channel selector cycle. The power transmission means may be, for example, a so-called mutilated gear, driven by the motive means, which engages cooperating gearing on the receiver tuning shaft only for a sufficient time to move the tuning shaft to an adjacent channel position and is disengaged for a longer period of the time to enable the viewer momentarily to sample the program being transmitted before shifting to the next channel.

For automatic channel selection, the motive means for the tuning shaft is also adapted to drive a reversible carriage carrying left and right switch actuator means to move the latter along a path between an array of push buttons and left and right starting switches for the motive means. The latter switches are normally open and are connected, respectively, in circuits for energizing the motive means to cause it to rotate in opposite directions. Intermediate the left and right switch actuator means are mounted normally closed left and right stop switches which are connected in the respective energizing circuits for the motive means and which are adapted to be actuated by the first actuated push-button in the direction that the carriage is moving. The push-buttons correspond to the television channels available on the receiver and they are preferably constructed so that after actuation, a push-button remains actuated until released by actuation of another push-button.

For a better understanding of the invention, reference is made to the following detailed description of a representative embodiment, taken in connection with the accompanying drawings in which.

Figures 1, 5:
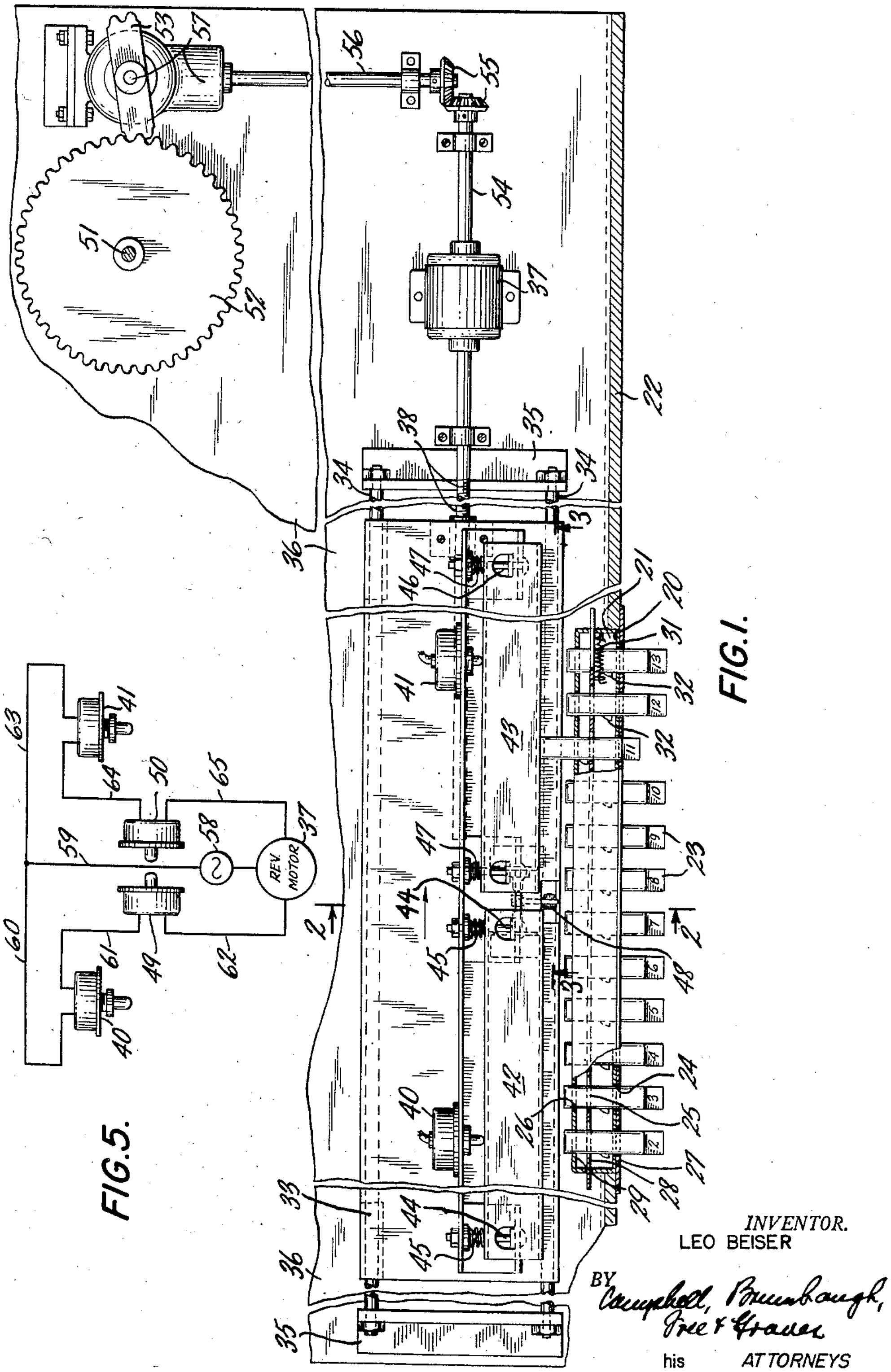
Fig. 1 is a plan view, partially in schematic form of a typical automatic tuning mechanism constructed according to the invention.
Fig. 5 is a circuit diagram showing a typical electrical switching circuit in which the mechanism shown in Fig. 1 may be employed.
Figure 2:
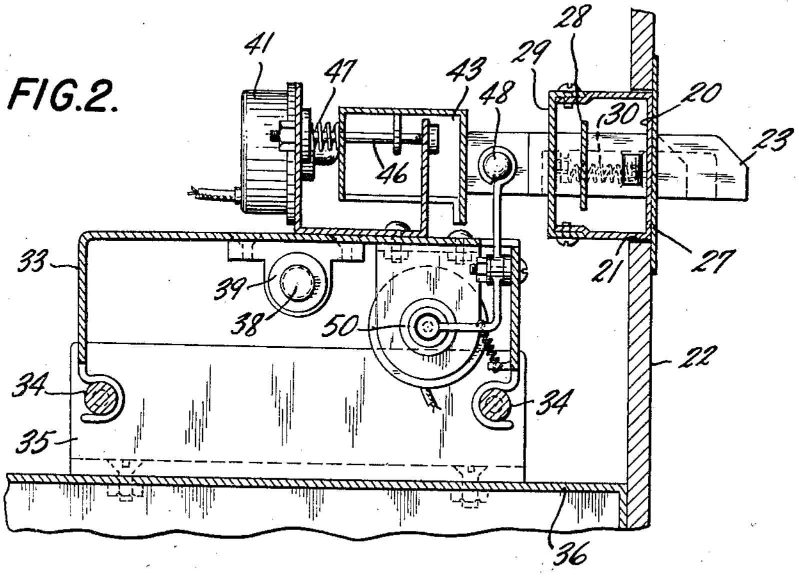
Fig. 2 is a transverse section of the mechanism of Fig. 1 taken along the view line 2—2 looking in the direction of the arrows.
Figure 3:
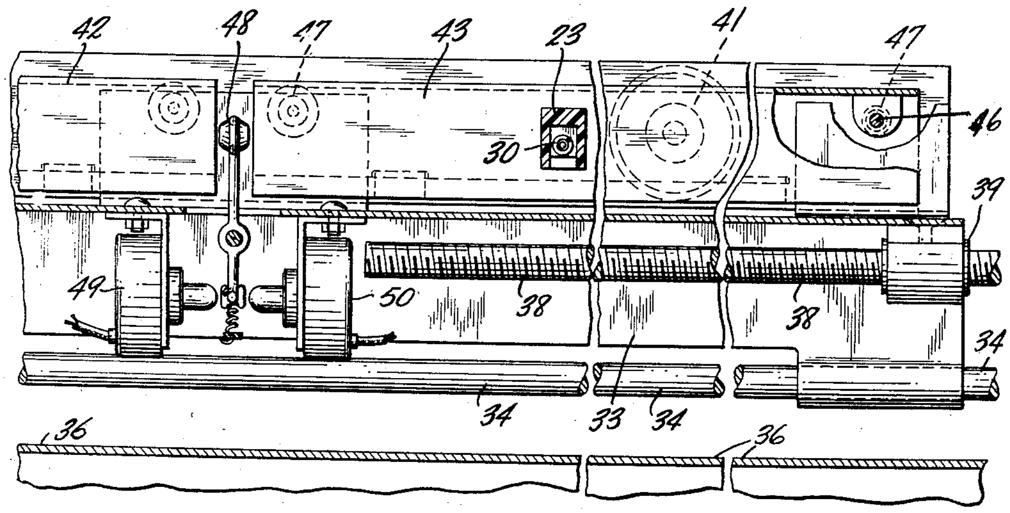
Fig. 3 is a view in longitudinal section taken along the line 3—3 of Fig. 1 looking in the direction of the arrows.

Referring now to Figs. 1 and 2, which show one form of apparatus embodying the invention, push-button actuator mechanism 20 is shown mounted by suitable means within an appropriate opening 21 in a television cabinet 22. The push-button actuator mechanism 20 is of the well known type in which any button remains depressed after having been actuated, until released by actuation of another button. In the form shown in Figs. 1 and 2 by way of example, the push-button actuator mechanism 20 comprises a plurality of spaced apart push-buttons 23 (Fig. 1) movably mounted in slots 24, 25 and 26 provided therefor in a facing member 27, a retaining member 28 and a backing member 29 respectively in the push-button actuator mechanism 20. Each push-button 23 is biased in an extended position by means of a spring 30.

The retaining member 28 is movable laterally of the push-buttons 23 and is biased in one direction by means of a spring 31. In addition, each button 23 is provided with an external cam member 32 arranged to displace the retaining member 28 laterally during depression of push-button 23. Thus, any depressed push-button 23 is retained in that state by the retaining member 28 until the latter is again displaced laterally by depression of another one of the push-buttons 23.

Behind the push-button actuator mechanism 20 is a carriage 33 which is mounted for movement in opposite directions transversely of the push-buttons 23 on guide members 34 secured to supports 35 mounted on the base of the television cabinet 36. The carriage 33 is adapted to be moved along the guide members 34 by a reversible motor 37, the shaft of the latter constituting a lead screw 38 cooperating with a nut 39 secured to the carriage 33 for this purpose.

Mounted on the carriage 33 in spaced apart relation longitudinally thereof are left and right start switches 40 and 41, respectively, which are adapted to be actuated by left and right switch actuators 42 and 43, respectively, in response to actuation of a push-button 23 as described in greater detail below. As shown, the left switch actuator 42 is mounted on spaced guides 44 for movement towards and away from the switch 40 and is normally biased away from the switch 40 by springs 45, so that the switch 40 is normally open.

Similarly, the right switch actuator 43 is mounted on spaced guides 46 for movement towards and away from the switch 41. Also, it is normally biased away from the switch 41 by springs 47, so that the switch 41 is normally open.

Between the left and right switch actuators 42 and 43 is secured a stop member 48 which is adapted to be actuated by the first depressed push-button 23 in whichever direction the carriage 33 is travelling at the moment to actuate one or the other of two stop switches 49 and 50, depending on the direction of travel of the carriage 33.

For automatic channel selection in response to actuation of one of the push-buttons 23, the tuner shaft 51 is connected to be driven by the reversible motor 37. In order to secure the desired channel stepping action with a momentary dwell period after the arrival of the shaft 51 at a position corresponding to a given channel, the shaft 51 carries a gear 52 which is adapted to be engaged intermitently by a multilated gear 53 driven by the motor 37 through the shaft 54, the gearing 55, the shaft 56 and a speed reducer 57. The speed reduction properties of the later should desirably be such as to rotate the mutilated gear 53 at the rate of about 50 R. P. M. so that the two opposite segments thereof will advance the shaft 51 at the rate of about 100 channel changes per minute.

In order to provide a smooth, quiet channel changing cycle, the gear 53 should preferably be shaped so as to transmit driving power to the shaft 51 over a large enough fraction of the cycle to maintain full control of the detent (not shown) conventionally associated with the shaft 51. In other words, power should be applied to the shaft 51 from the start of the detent cycle through the peak, and down to the trough of the detent cycle. While the fraction of the cycle over which power is transmitted may be varied, for optimum conditions it should be approximately one-sixth. The lead screw 38 also should be designed so that for each unit of travel of the carriage 33 corresponding to the spacing between two adjacent push-buttons 23, the tuner shaft 51 is advanced one channel position.

As shown in Fig. 5, the normally open left start switch 40 and the normally closed stop switch 49 are connected in an energizing circuit including a source of electrical energy 58 and the conductors 59, 60, 61 and 62, which is adapted to energize the motor 37 to cause the carriage 33 to move to the left. Similarly, the normally open right start switch 41 and the normally closed stop switch 50 are connected in another energizing circuit including the source of electrical energy 58 and the conductors 59, 63, 64 and 65 which is adapted to energize the motor 37 to move the carriage 33 to the right.

In a typical operation of the above-described embodiment of the invention, assume that the carriage 33 is initially in the position shown in Fig. 1 with the stop 48 at rest between the push-buttons 23 corresponding to channels 7 and 8. If now, it is desired to tune the receiver to another channel, said channel 11, the bush-button 23 corresponding thereto is depressed. This moves the right switch actuator 43 rearwardly and causes it to close the right start switch 41, energizing the motor 37 in the direction to move the carriage 33 to the right. Since the push-button 23 for channel 11 remains depressed until another push-button has been actuated, the switch 41 remains closed. The carriage 33 travels towards the right until the stop member 48 engages the depressed push-button 23 for channel 11. This opens the right stop switch 50 and deenergizes the motor 37 so that the carriage 33 comes to rest.

Simultaneously with the rightward travel of the carriage 33, the mutilated gear 53 intermittently advances the shaft 51 to successive channel positions, stopping at the channel 11 position when the motor 37 comes to rest.

During operation of the channel selecting mechanism, the mutilated gear 53 serves to advance the tuner shaft 51 one channel for each unit of movement of the carriage 33 corresponding to one push-button interval. Because of the nature of the mutilated gear 53, although the motor 37 is in continuous motion, driving power is transmitted to the tuner shaft 51 during only a fraction of one complete revolution of the mutilated gear 53. As a result, the channel changing operation is rapid while the mutilated gear 53 is engaged, and while power is being transmitted. This is clearly shown by Figs. 4A, 4B and 4C.

Figure 4A:
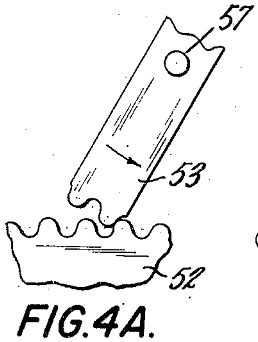
Figs. 4A, 4B and 4C are detail views showing different positions of engagement of the mutilated gear means and the gear means on the tuning shaft.
Figure 4B:
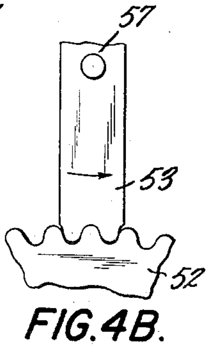
Figure 4C:
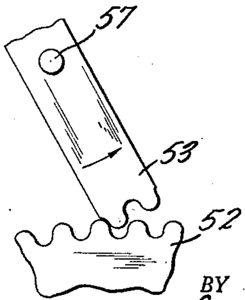

In Figure 4A, the teeth of mutilated gear 53 engage the tuner shaft gear 52 at the start of the power cycle, while the tuner shaft 51 is in the trough of its detent. In Fig. 4B, the teeth of mutilated gear 53 are fully meshed with those of gear 52, providing strong and positive action at the crest of the detent. Figure 4C shows the end of the power cycle, where the teeth of the mutilated gear 53 swing free and the tuner shaft 51 is in the trough of the detent of the next channel. In this way, full control of the detent is maintained, providing a smooth, quiet channel change.

During a considerable portion of its revolution, the mutilated gear 53 is disengaged from the tuner shaft 51 and gear 52, providing a period of dwell during which no power is transmitted. This period of dwell permits the viewer to scan each successive channel to which the receiver is tuned on the way to the selected channel. If a particular program being sent over an intermediate channel attracts his interest, the selecting system may be stopped at that channel merely by depressing the appropriate push-button 23.

It will be understood that the television receiver may be manually tuned in the conventional manner without disturbing the automatic tuning mechanism. In the event that the mutilated gear 53 and the gear 52 are found engaged, which is unlikely, they will become disengaged as soon as manual tuning is attempted. Further, it may be preferred, where manual tuning is desired, to drive the carriage directly from the tuner shaft, thus insuring that the carriage position is registered with the tuner position. In this event, it will also be necessary to provide means to return the depressed push-button 23 to neutral, so that interference of the push-button 23 with the stop member 48 is avoided during manual operation. For example, an additional reset button labeled "manual" could be provided on the push-button actuator mechanism for this purpose.

The invention thus provides novel and highly effective automatic channel selector mechanism for television receivers and the like which affords a quiet and smooth channel changing cycle. Further, by providing means such as a mutilated gear, for example, a momentary period of dwell may be produced after each channel change to enable the viewer to sample the program then being transmitted over that channel.

It will be understood that the above-described embodiment of the invention is illustrative only and modifications will occur to those skilled in the art. Therefore, the invention is not to be limited to the specific apparatus disclosed herein, but is to be defined in the appended claims.

I claim:

1. In automatic tuner apparatus, the combination of an array of actuatable push-buttons representing a plurality of tuning positions, respectively, a member mounted for movement with respect to said push-buttons, tuning position adjusting means, motive means for driving said tuning position adjusting means and said member, means carried by said member for initiating operation of said motive means to drive said member in one direction, and actuator means on said member actuatable by any push-button in said array lying between a fixed location on said member and one end of said array for actuating said initiating means.

2. In automatic tuner apparatus, the combination of an array of actuatable push-buttons representing a plurality of tuning positions, respectively, a member mounted for movement with respect to said push-buttons, switching means carried by said member, switch actuator means on said member actuatable by any push-button in said array lying between a fixed reference location on said member and one end of said array to actuate said switching means, tuning position adjusting means, motive means for driving said tuning position adjusting means and said member, and an energizing circuit for said motive means and including said switching means.

3. In automatic tuner apparatus, the combination of an array of actuatable push-buttons representing a plurality of tuning positions, respectively, a member mounted for movement with respect to said push-buttons, normally open starting switch means carried by said member, starting switch actuator means on said member actuatable by depression of any push-button in said array lying between a fixed reference location on said member and one end of said array to actuate said starting switch means, normally closed stop switch means carried by said member, said stop switch means being actuatable by contact with said depressed push-button during transverse movement of said member, tuning position adjusting means, motive means for driving said tuning position adjusting means and said member, and an energizing circuit for said motive means and including said starting switch means and said stop switch means.

4. In automatic tuner apparatus, the combination of an array of actuatable push-buttons representing a plurality of tuning positions, respectively, a carriage mounted for movement in opposite directions transversely of said push-buttons, normally open left and right starting switch means carried by said carriage and spaced apart longitudinally thereof, left starting switch actuator means on said carriage actuatable by depression of any push-button in said array lying between a fixed reference location on said carriage and the left end of said array to actuate said left starting switch means, right starting switch actuator means on said carriage actuatable by depression of any push-button in said array lying between said fixed reference location on said carriage and the right end of said array to actuate said right starting switch means, normally closed left and right stop switch means carried by said carriage, one of said stop switch means being actuatable by contact with a depressed push-button during transverse movement of said carriage, tuning position adjusting means, motive means for driving said tuning position adjusting means and said carriage, a first energizing circuit for said motive means and including said left starting switch means and said left stop switch means, and a second energizing circuit for said motive means and including said right starting switch means and said right stop switch means.

5. Automatic tuner apparatus as in claim 4 wherein the tuning position adjusting means comprises a power transmission means and cooperating gear means on a receiver tuning shaft, said power transmission means effectively engaging said cooperating gear means during only a portion of one tuning position change cycle.

6. The automatic tuner apparatus as in claim 4 wherein the tuning position adjusting means comprises a receiver tuning shaft coupled to said driving means by gearing including a multilated gear, whereby power is transmitted to said shaft during only a portion of one tuning change cycle.

References Cited in the file of this patent

UNITED STATES PATENTS

| | | |
|---|---|---|
| 1,979,588 | Vreeland | Nov. 6, 1934 |
| 2,409,895 | Phelps | Oct. 22, 1946 |